United States Patent [19]
Kohno

[11] Patent Number: 6,157,580
[45] Date of Patent: Dec. 5, 2000

[54] SEMICONDUCTOR MEMORY DEVICE CAPABLE OF EASILY CONTROLLING A REFERENCE RATIO REGARDLESS OF CHANGE OF A PROCESS PARAMETER

[75] Inventor: Takaki Kohno, Tokyo, Japan

[73] Assignee: NEC Corporation, Tokyo, Japan

[21] Appl. No.: 09/396,401

[22] Filed: Sep. 15, 1999

[30] Foreign Application Priority Data

Sep. 22, 1998 [JP] Japan ................................. 10-267766

[51] Int. Cl.[7] ........................................................ G11C 7/00
[52] U.S. Cl. ............................ 365/189.09; 365/185.11; 365/185.2; 365/210
[58] Field of Search ........................... 365/189.09, 185.2, 365/210, 185.21, 185.11

[56] References Cited

U.S. PATENT DOCUMENTS

| | | | |
|---|---|---|---|
| 5,517,448 | 5/1996 | Liu ........................ | 365/185.11 |
| 5,729,492 | 3/1998 | Campardo .............. | 365/185.2 |
| 5,793,690 | 8/1998 | Iwahashi ................ | 365/185.2 |
| 5,966,330 | 10/1999 | Tang et al. ............ | 365/185.2 |

FOREIGN PATENT DOCUMENTS 6-104406   4/1994   Japan .

*Primary Examiner*—Son T. Dinh
*Attorney, Agent, or Firm*—Young & Thompson

[57] ABSTRACT

A semiconductor memory device comprises matrix memory cell banks, a reference cell bank device, and a sense circuit. The matrix memory cell banks and the reference cell bank device have deputy bit lines which are implemented by embedded diffused layers, respectively. Each of the matrix memory cell banks comprises a first set of memory cells. The first set of memory cells are for holding data. The reference cell bank device comprises a predetermined number of reference cell banks which are directly connected. Each of the reference cell banks comprises a second set of reference cells. The reference cells are for holding reference voltages. The sense circuit receives data voltages which are read out from the matrix memory cell banks and the reference voltages from the reference cell bank device to determine levels of the data voltages by comparing the data voltages with the reference voltages.

4 Claims, 13 Drawing Sheets

SEMICONDUCTOR MEMORY DEVICE CAPABLE OF EASILY CONTROLLING A REFERENCE RATIO REGARDLESS OF CHANGE OF A PROCESS PARAMETER

BACKGROUND OF THE INVENTION

This invention relates to a semiconductor memory device and a method of manufacturing the semiconductor memory device.

DESCRIPTION OF THE PRIOR ART

A conventional semiconductor memory device is disclosed in Japanese Unexamined Patent Publication (koukai) NO. 104406/1994 and U.S. Pat. No. 5,517,448. In the manner which will later be described in detail, the conventional semiconductor memory device of the type described is implemented by mask ROMs of flat type. The conventional semiconductor memory device comprises a matrix memory cell device, an address buffer circuit, a Y decoder, a bank select decoder, a X decoder, a virtual GND decoder, a virtual GND selector, a Y selector, a sense circuit, and an output buffer circuit. The matrix memory cell device comprises matrix memory cells which are implemented by memory cells. The memory cells are for holding or memorizing data. The matrix memory cell device comprises matrix memory cell banks, reference memory cell banks, and deputy bit lines which are implemented by embedded diffused layers.

However, there is a problem that a reference ratio is, in practice, easily shifted from a layout value in response to change of a process parameter in case of manufacturing the conventional semiconductor memory device.

SUMMARY OF THE INVENTION

It is therefore an object of this invention to provide a semiconductor memory device which is capable of easily controlling the reference ratio regardless of change of the process parameter in case of manufacturing the semiconductor memory device.

It is another object of this invention to provide a semiconductor memory device which is capable of increasing a sense speed of the semiconductor memory device.

Other objects of this invention will become clear as the description proceeds.

According to a first aspect of this invention, there is provided a semiconductor memory device which comprises matrix memory cell banks, a reference cell bank device, and a sense circuit, the matrix memory cell banks and the reference cell bank device having deputy bit lines which are implemented by embedded diffused layers, respectively, wherein:

each of the matrix memory cell banks comprises a first set of memory cells, respectively, the first set of memory cells for holding data;

the reference cell bank device comprising a predetermined number of reference cell banks which are directly connected, each of the reference cell banks comprising a second set of reference cells, the reference cells for holding reference voltages; and the sense circuit connected to the matrix memory cell banks and to the reference cell bank device for receiving data voltages which are read out from the matrix memory cell banks and the reference voltages from the reference cell bank device to determine levels of the data voltages by comparing the data voltages with the reference voltages.

According to a second aspect of this invention, there is provided a semiconductor memory device which comprises matrix memory cell banks, reference cell bank devices, and a sense circuit, the matrix memory cell banks and the reference cell bank devices having deputy bit lines which are implemented by embedded diffused layers, respectively, wherein:

each of the matrix memory cell banks comprises a first set of memory cells, respectively, the first set of memory cells for holding data;

each of the reference cell bank devices comprising a predetermined number of reference cell banks which are directly connected, each of the reference cell banks comprising a second set of reference cells, the reference cells for holding reference voltages; and the sense circuit connected to the matrix memory cell banks and to the reference cell bank devices for receiving data voltages which are read out from the matrix memory cell banks and the reference voltages from the reference cell bank devices to determine levels of the data voltages by comparing the data voltages with the reference voltages.

According to a third aspect of this invention, there is provided a method of manufacturing a semiconductor memory device, comprising:

a step of preparing a semiconductor memory device to comprise matrix memory cell banks, a reference cell bank device, and a sense circuit, the matrix memory cell banks and the reference cell bank device having deputy bit lines which are implemented by embedded diffused layers, respectively;

a step of forming each of the matrix memory cell banks to comprise a first set of memory cells, respectively, the first set of memory cells for holding data;

a step of forming the reference cell bank device to comprise a predetermined number of reference cell banks which are directly connected, each of the reference cell banks comprising a second set of reference cells, the reference cells for holding reference voltages; and a step of forming the sense circuit to be connected to the matrix memory cell banks and to the reference cell bank device, the sense circuit receiving data voltages which are read out from the matrix memory cell banks and the reference voltages from the reference cell bank device to determine levels of the data voltages by comparing the data voltages with the reference voltages.

According to a fourth aspect of this invention, there is provided a method of manufacturing a semiconductor memory device, comprising:

a step of preparing a semiconductor memory device to comprise matrix memory cell banks, reference cell bank devices, and a sense circuit, the matrix memory cell banks and the reference cell bank devices having deputy bit lines which are implemented by embedded diffused layers, respectively;

a step of forming each of the matrix memory cell banks to comprise a first set of memory cells, respectively, the first set of memory cells for holding data;

a step of forming each of the reference cell bank devices to comprise a predetermined number of reference cell banks which are directly connected, each of the reference cell banks comprising a second set of reference cells, the reference cells for holding reference voltages; and a step of forming the sense circuit to be connected to the matrix memory cell banks and to the reference cell bank devices, the sense circuit receiving data voltages which are read out from the matrix memory cell banks and the reference voltages from the reference cell bank devices to determine levels of the data voltages by comparing the data voltages with the reference voltages.

DESCRIPTION OF THE PREFERRED EMBODIMENTS

Referring to FIG. 1, 2, 3, 4, 5, 6, and 7, a conventional semiconductor memory device will first be described for a better understanding of this invention.

Figure 1:
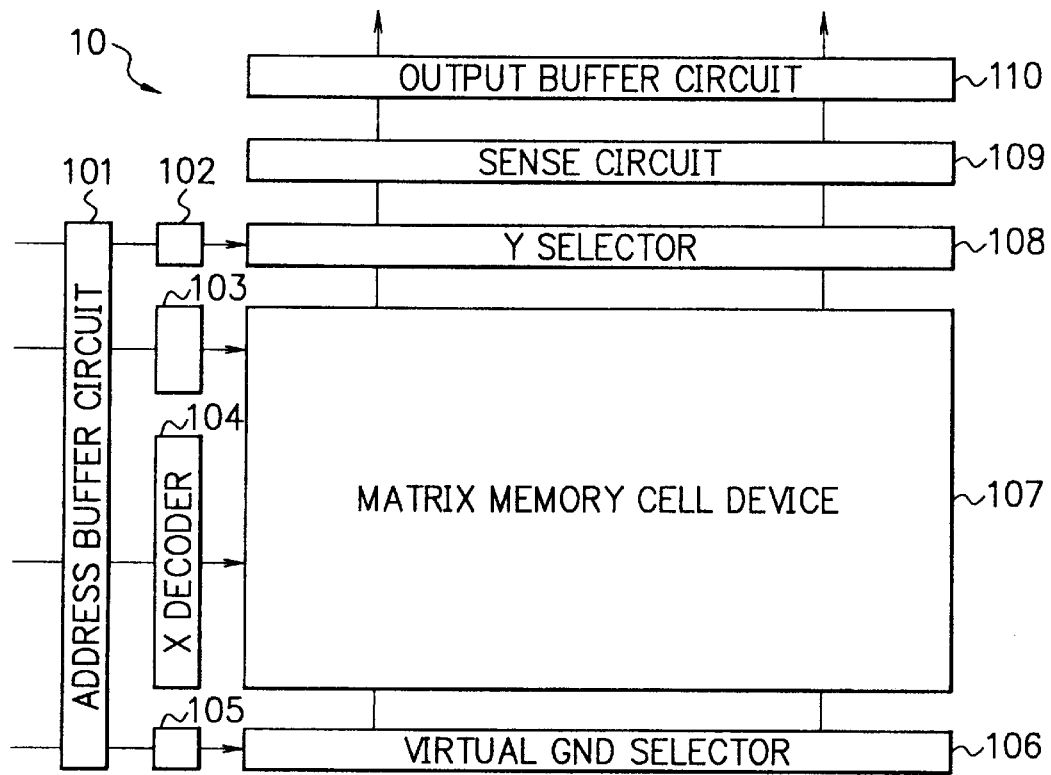
FIG. 1 a block diagram of a conventional semiconductor memory device.

In FIG. 1, the conventional semiconductor memory device 10 is implemented by mask ROMs of flat cell type. The conventional semiconductor memory device 10 comprises a matrix memory cell device 107, an address buffer circuit 101, a Y decoder 102, a bank select decoder 103, a X decoder 104, a virtual GND decoder 105, a virtual GND selector 106, a Y selector 108, a sense circuit 109, and an output buffer circuit 110. The matrix memory cell device 107 comprises matrix memory cells which are implemented by memory cells. The memory cells are for holding or memorizing data.

The Y decoder 102, the bank select decoder 103, the X decoder 104, and the virtual GND decoder 105 are connected to the address buffer circuit 101. The virtual GND selector 106 is connected to the virtual GND decoder 105. The matrix memory device 107 is connected to the bank select decoder 103, to the X decoder 104, and to the virtual GND selector 106. The Y selector 108 is connected to the Y decoder 102 and to the matrix memory device 107. The sense circuit 109 is connected to the Y selector 108. The output buffer circuit 110 is connected to the sense circuit 109.

The conventional semiconductor memory device 10 is supplied with an address input signal from an outside device (not shown). The Y decoder 102, the bank select decoder 103, the X decoder 104, and the virtual GND decoder 105 select, in response to the address input signal, the memory cells in the matrix memory device 107. The Y selector 108, the sense circuit 109, and the output buffer circuit 110 reads out data of the memory cells which are selected.

Figure 2:
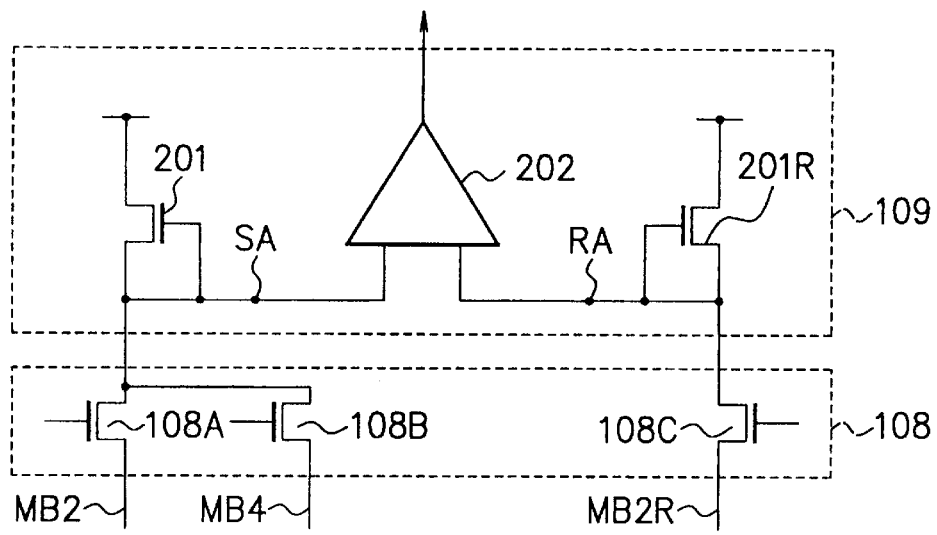
FIG. 2 is a circuit diagram of a Y selector and a sense circuit of the conventional semiconductor memory device illustrated in FIG. 1.

In FIG. 2, the Y selector 108 comprises transistor switches 108A, 108B, and 108C. Source electrodes of the transistor switches 108A and 108B are connected to main bit lines MB2, and MB4 of memory cell banks. Source electrodes of transistor switch 108C is connected to a main bit line MB2R of reference cell banks. The sense circuit 109 comprises a transistor switch 201, a differential amplifier 202, and a transistor switch 201R. Drain electrodes of the transistor switches 108A and 108B are connected to a source electrode and a gate electrode of the transistor switch 201. Also, the drain electrodes of the transistor switches 108A and 108B are connected to an input terminal of the differential amplifier 202 through a node SA. Drain electrode of the transistor switch 108C is connected to a source electrode and a gate electrode of the transistor switch 201R. Also, the drain electrode of the transistor switches 108C is connected to another input terminal of the differential amplifier 202 through a node RA.

The node SA is an output node of the memory cell of the memory cell banks that holds data. The node RA is an output node of reference cell of the reference cell banks. Voltages of the nodes SA and RA are determined in response to the data of the memory cell of the memory cell banks. Here, it is assumed that the voltage of the node RA is VRA which will hereafter be called a reference voltage. It is assumed that the voltage of the node SA is VSA(ON) when the memory cell to be selected is ON. Also, it is assumed that the voltage of the node SA is VSA(OFF) when the memory cell to be selected is OFF. In this event, VSA(ON) and VSA (OFF) are given by a following formula (1).

$$VSA(ON) < VRA < VSA(OFF) \tag{1}$$

Figure 3:
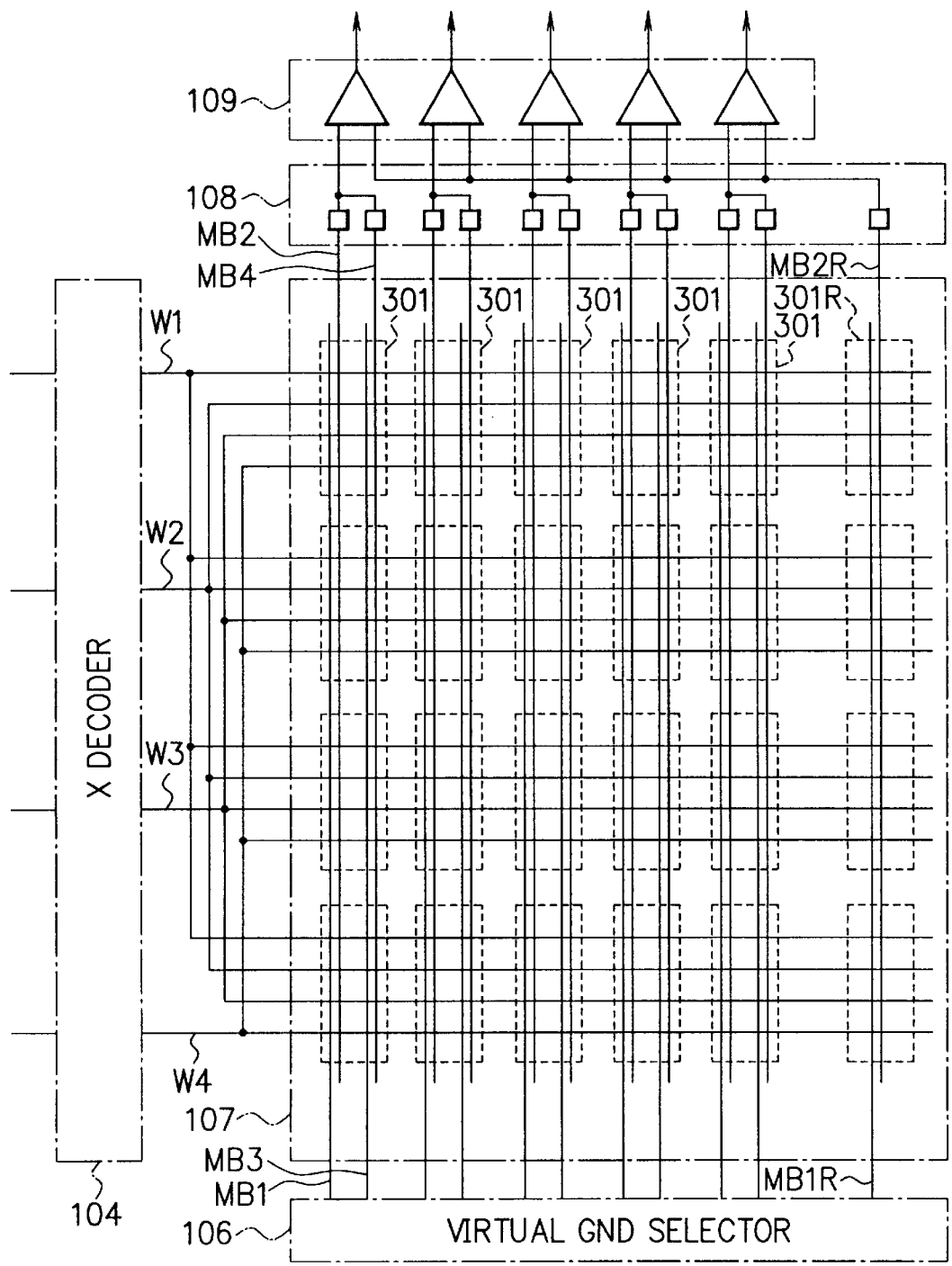
FIG. 3 is a block diagram of a matrix memory cell device of the conventional semiconductor memory device illustrated in FIG. 1.

In FIG. 3, the matrix memory cell device 107 comprises matrix memory cell banks 301 and reference cell banks 301R. The matrix memory cell banks 301 comprises a first set of memory cells, respectively. The first set of memory cells are for holding data. The reference memory banks 301R comprises a second set of reference cells. The reference cells of the reference cell banks 301R hold reference voltages.

Word lines W1, W2, W3, and W4 are, in cross direction, positioned in the memory cell banks 301. The main bit lines MB2 and MB4 are, in machine direction, positioned in the memory cell banks 301 so that the main bit lines MB2 and MB4 are, in cross, positioned to the word lines W1 to W4. Also, virtual GND lines MB1 and MB3 are, in parallel to the main bit lines MB2 and MB4 in the memory cell banks 301.

The word lines W1 to W4 are, in cross direction, positioned in the reference cell banks 301R. The main bit line MB2R is, in machine direction, positioned in the reference cell banks 301R so that the main bit line MB2R is, in cross, positioned to the word lines W1 to W4. Also, virtual GND lines MB1R is, in parallel to the main bit line MB2R in the reference cell banks 301R. In addition, such as a method of connecting the word lines W1 to W4, the main bit lines MB2, MB4, and MB2R, and the virtual GND lines MB1, MB3, and MB1R and a method of selecting the memory cell will later be described in detail.

On the other hand, the X decoder 104 selects, in response to the address input signal, one of the word lines W1 to W4. The X decoder 104 selects one set of the memory cells which are, in cross direction, positioned in each of the memory cell banks 301 and the reference cell banks 301R.

The virtual selector 106 is connected to the virtual GND lines MB1, MB3, and MB1R. The virtual selector 106 selects one of the virtual GND lines MB1, MB3, and MB1R to connect the memory cell to be selected to the ground.

The Y selector 108 is connected to the main bit lines MB2, MB4, and MB2R from each of the memory cell banks 301 and the reference cell banks 301R. In addition, the transistor switches 108A, 108B, and 108C of the Y selector 108 are connected to the main bit lines MB2, MB4, and MB2R. The Y selector 108 selects one of the main bit lines MB2, MB4, and MB2R.

The sense circuit 109 is, through the Y selector 108, connected to one of the main bit lines MB2 and MB4 from the and the memory cell banks 301 and the main bit lines MB2R from the reference cell banks 301R. The sense circuit 109 compares data voltages from the memory cell banks 301 with the reference voltages from the reference cell banks 301R to determine levels of the data which are read out.

Figure 4:
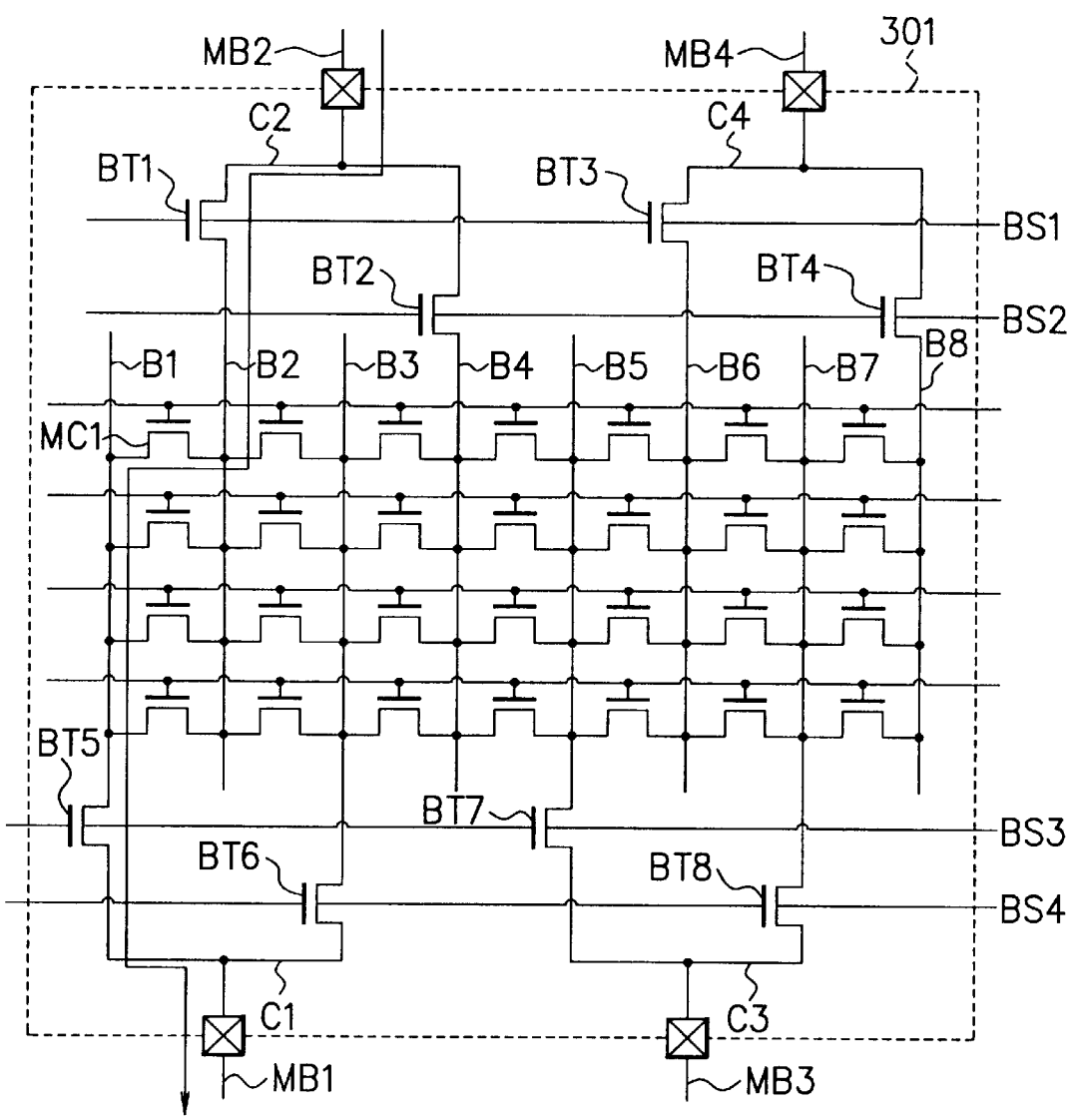
FIG. 4 is a circuit diagram of a memory cell bank of the conventional semiconductor memory device illustrated in FIG. 1.

In FIG. 4, the memory cell bank 301 comprises matrix memory cells MC1. The memory cells MC1 have drain electrodes and source electrodes which are connected to one of deputy bit lines. The memory cells MC1 have gate electrodes which are connected to one of the word lines W1 to W4. For example, the memory cells MC1 of leftmost and uppermost side in FIG. 4 has the drain electrode which is connected to the deputy bit line B1, the source electrode which is connected to the deputy bit line B2, and the gate electrode which is connected to the word lines W1 . Each of the memory cells MC1 is implemented by an enhancement transistor of N type. Each of the deputy bit lines is implemented by an embedded diffused layer of N type. Each of the word lines W1 to W4 is implemented by a polysilicon layer.

On the other hand, the memory cell bank 301 further comprises bank select transistors BT1 to BT8 each of which is implemented by MOSFET. The bank select transistors BT1 to BT8 read out data form the memory cells MC1. The bank select transistors BT1 and BT2 are connected to the main bit line MB2 through a contact area C2. The bank select transistors BT3 and BT4 are connected to the main bit line MB4 through a contact area C4. A bank select line BS1 is connected to gate electrodes of the bank select transistors BT1 and BT2. A bank select line BS2 is connected to gate electrodes of the bank select transistors BT2 and BT4.

Consequently, when the bank select line BS1 is selected and a voltage Vcc is supplied to the bank select line BS1, the main bit line MB2 is connected to the deputy bit line B2 and the main bit line MB4 is connected to the deputy bit line B6. Also, when the bank select line BS2 is selected and the voltage Vcc is supplied to the bank select line BS2, the main bit line MB2 is connected to the deputy bit line B4 and the main bit line MB4 is connected to the deputy bit line B8.

Also, the bank select transistors BT5 and BT6 are connected to the virtual GND line MB1 through the contact area C1. The bank select transistors BT7 and BT8 are connected to the virtual GND line MB3 through a contact area C3. A bank select line BS3 is connected to gate electrodes of the bank select transistors BT5 and BT7. A bank select line BS4 is connected to gate electrodes of the bank select transistors BT6 and BT8.

Consequently, when the bank select line BS3 is selected and the voltage Vcc is supplied to the bank select line BS3, the virtual GND line MB1 is connected to the deputy bit line B1 and the virtual GND line MB3 is connected to the deputy bit line B5. Also, when the bank select line BS4 is selected and the voltage Vcc is supplied to the bank select line BS4, the virtual GND line MB1 is connected to the deputy bit line B3 and the virtual GND line MB3 is connected to the deputy bit line B7.

Figure 5:
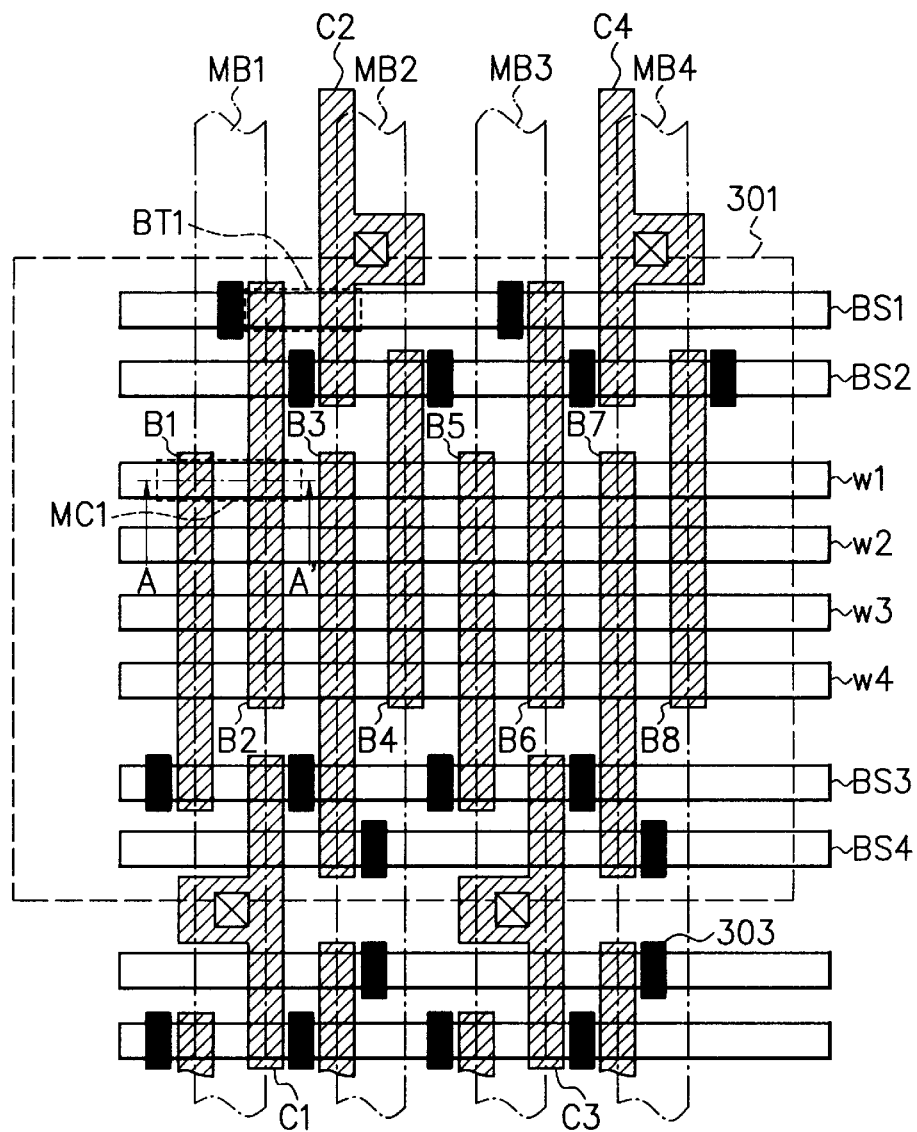
FIG. 5 is a view of a layout pattern of the memory cell bank illustrated in FIG. 4.
Figure 6:
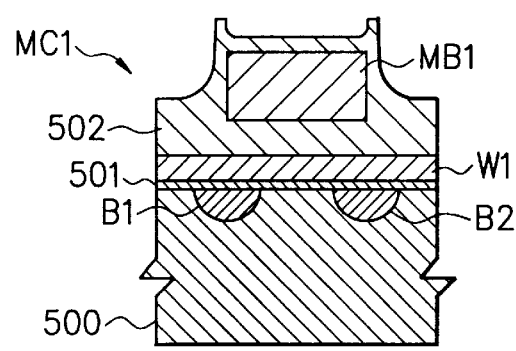
FIG. 6 is a schematic sectional view taken along a line A-A' in FIG. 5.

FIG. 5 shows a layout pattern of the memory cell bank 301. FIG. 6 is a schematic sectional view taken along a line A–A' in FIG. 5. In FIG. 5, the deputy bit lines B1 to B8 are, in machine direction and in parallel, positioned in the memory cell bank 301. The word lines W1 to W4 are positioned in cross to the deputy bit lines B1 to B8. Also, the bank select lines BS1 and BS2 are, in parallel, positioned in a side of the contact areas C2 and C4 from the word lines W1 to W4. The bank select lines BS3 and BS4 are, in parallel, positioned in a side of the contact areas C1 and C3 from the word lines W1 to W4.

In addition, it needs to prevent leak of currents which area supplied to the bank select lines BS1 to BS4, namely, it needs to prevent occurrence of a parasitic transistor of N type in the memory cell bank 301. Therefore, channel stopper layers 303 are formed in the memory cell bank 301 by implanting ions of impurities of P type in he memory cell bank 301. For example, the impurities of P type are implemented by boron.

On the other hand, in FIG. 6, the deputy bit lines B1 and B2 are formed by implanting ions of N+ type in a semiconductor substrate 500 which is made of such as silicon. The deputy bit lines B1 and B2 serve as source electrodes and drain electrodes. A gate oxide layer 501 is formed on a surface of the semiconductor substrate 500 and the deputy bit lines B1 and B2. The word line W1 is formed on the gate oxide layer 501. The word line W1 is made of such as polysilicon. The word line W1 serves as a gate electrode. An insulating layer 502 is formed on the word line W1 . The main bit line MB1 is formed on the insulating layer 502 so that the main bit line MB1 is positioned in cross to the paper surface.

Thus, the semiconductor memory device comprises memory cells having the source electrodes and the drain electrodes which area the deputy bit lines in the memory cell bank 301. Also, the deputy bit line is called Burried N type (BN) bit line. BN bit lines are implemented by an embedded diffused layers. Therefore, a sheet resistance value of the semiconductor memory device is 200 Ω/□ and is high. For example, in case that a width of the BN bit line is 0.5 μm and a length of the BN bit line is 50 μm, a resistance value of the BN bit line becomes about 20 kΩ and is equal to an about resistance value of the memory cell in case that the memory cell is ON.

Consequently, in layout of the semiconductor memory device of flat cell type, it needs to consider process parameter dependency of resistance value, power supply dependency, and temperature dependency. Particularly, in layout of the semiconductor memory device of flat cell type, it needs to consider a reference ratio. Otherwise, it is difficult to realize high-speed operation of the semiconductor memory device. The reference ratio will later be described in detail.

On the other hand, data to be held in the memory cells are determined in response to request of a user in a time of manufacturing the semiconductor memory device. A logic value "0" or a logic value "1", as data, is written in each of the memory cells by controlling a threshold voltage of each of the memory cells. Namely, ions are implanted so that a low-level threshold voltage (VTL) or a high-level threshold voltage (VTH) is given in response to a logic value to be written. For example, it is assumed that a voltage of the word line to be selected in a time of reading data is Vcc. In this event, VTL and VTH are given by a following formula (2).

$$\text{VTL} < \text{Vcc} < \text{VTH} \tag{2}$$

In addition, generally, control of VTL and VTH is executed in a step of implanting ions in a time of manufacturing semiconductor memory device. Control of VTL and VTH is executed by controlling amount of dose of ions. For example, boron is used as implanting material of ions. Also, the bank select transistor BT1 is formed between the main bit lines MB1 and MB2 by the same method of manufacturing the memory cells. A threshold voltage is set and fixed at VTL. Similarly, each of threshold voltages the bank select transistor BT2 to BT8 is set and fixed at VTL.

Read of data of the memory cells is executed as followed. For example, in case that a threshold voltage of the memory cell MC1 is VTL, the memory cell MC1 becomes ON and a current flows in a direction indicated by an arrow in FIG. 4. As a result, a voltage of the node SA (FIG. 2) becomes to VSA (ON) which is the low level, namely, the voltage of the node SA becomes about 1.6 V. In this time, the memory cell MC1 will hereafter be called an ON cell.

On the other hand, in case that a threshold voltage of the memory cell MC1 is VTH, the memory cell MC1 becomes OFF. As a result, the voltage of the node SA (FIG. 2) becomes to VSA (OFF) which is the high level, namely, the voltage of the node SA becomes about 2 V.

In this time, the memory cell MC1 will hereafter be called an OFF cell.

Thus, the voltage of the node SA is changed in response to data of the memory cell to be selected. Therefore, the differential amplifier 202 compares the voltage of the node SA with VRA to amplify and produce an output voltage which has the GND level or Vcc.

Here, the reference ratio will be described in detail. It is assumed that the reference ratio is RTO, a resistance value of the reference cell in a case that the reference cell is ON is RRC, and a resistance value of the memory cell in a case that the memory cell is ON is RMC. In this event, RTO is given by a following formula (3).

$$\text{RTO} = \text{RRC}/\text{RMC} \tag{3}$$

Here, it needs that RTO is equal to a real number which is greater than 1. This is because, since VSA(ON) is equal to VRA when RTO is equal to 1, namely, RRC is equal to RMC, the formula (1) is not concluded.

Figure 7:
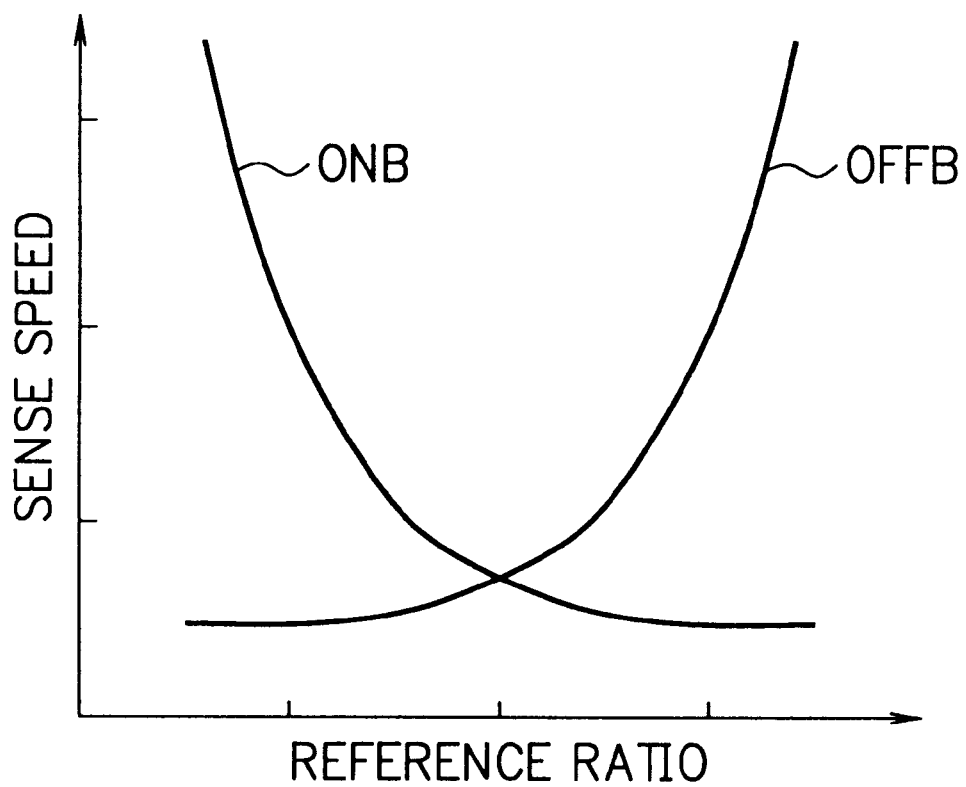
FIG. 7 is a view for describing a relation between a reference ratio and a sense speed in the conventional semiconductor memory device illustrated in FIG. 1.

FIG. 7 shows a view for describing a relation between the reference ratio RTO and a sense speed of the sense circuit 109. In FIG. 7 a line ONB shows a characteristic in case of ON bit. a line OFFB shows a characteristic in case of OFF bit. The line ONB has a almost opposite trend to the line OFFB.

In case of the ON bit, the sense speed becomes greater when the reference ratio RTO becomes smaller and the sense speed is decreased when the reference ratio RTO becomes greater. On the other hand, in case of the OFF bit, the sense speed becomes smaller when the reference ratio RTO becomes smaller and the sense speed is increased when the reference ratio RTO becomes greater. Therefore, in order to obtain the optimum sense speed in case of both of the ON bit and the OFF bit, it needs to use, as a layout value, the reference ratio RTO in case that the line ONB and the line OFFB are crossed.

However, there is a problem that the reference ratio RTO is, in practice, easily shifted from the layout value in response to change of the process parameter in case of manufacturing the conventional semiconductor memory device. For example, in case that the reference ratio RTO is shifted in a right direction from the layout value, there is problem that the sense speed of the ON bit is decreased although the sense speed of the OFF bit becomes greater.

In addition, a method laying out the reference ratio RTO is not disclosed in such as Japanese Unexamined Patent Publication (koukai) No. 104406/1994 and U. S. Pat. Publication No. 5,517,448.

It is therefore an object of this invention to provide a semiconductor memory device which is capable of easily controlling the reference ratio regardless of change of the process parameter in case of manufacturing the semiconductor memory device.

It is another object of this invention to provide a semiconductor memory device which is capable of increasing a sense speed of the semiconductor memory device.

Other objects of this invention will become clear as the description proceeds.

Referring to FIGS. 8, 9, 10, 11, 12, and 13, the description will proceed to a semiconductor memory device according to a first embodiment of this invention. Similar parts are designated by like reference numerals.

Figure 8:
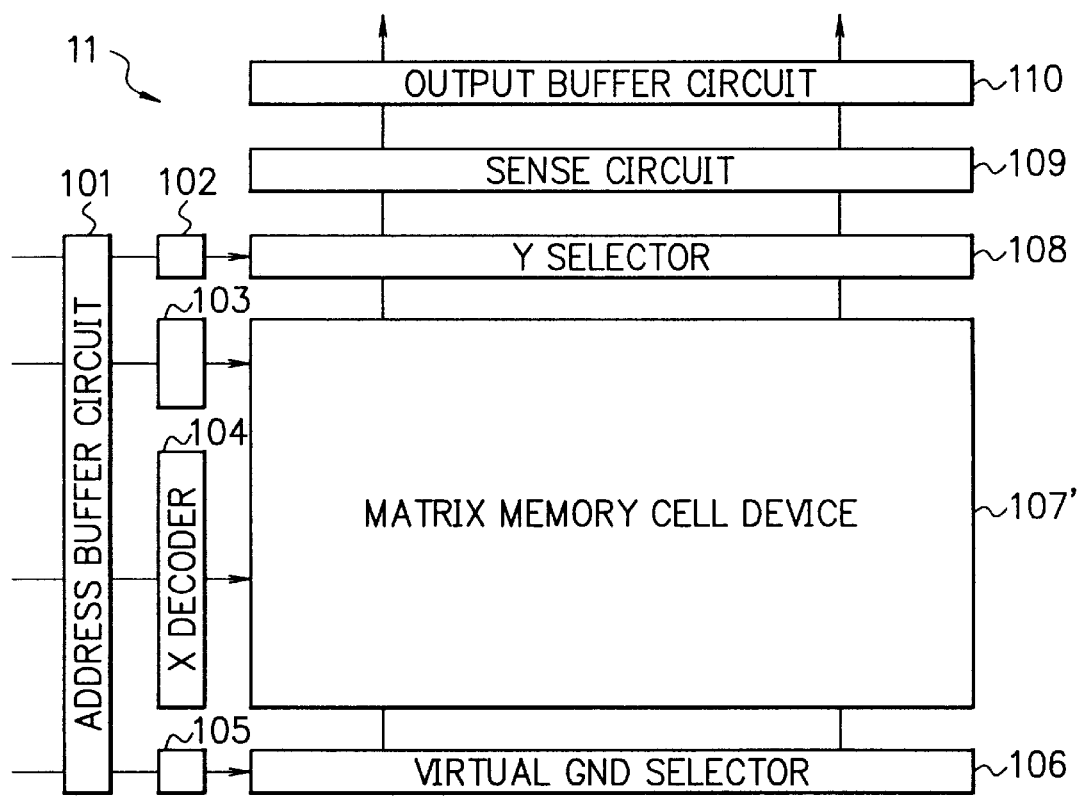
FIG. 8 is a block diagram of a semiconductor memory device according to a first embodiment of this invention.

In FIG. 8, the semiconductor memory device 11 is implemented by mask ROMs of flat cell type. The semiconductor memory device 11 comprises matrix memory cell device 107', the address buffer circuit 101, the Y decoder 102, the bank select decoder 103, the X decoder 104, the virtual GND decoder 105, the virtual GND selector 106, the Y selector 108, the sense circuit 109, and the output buffer circuit 110. The matrix memory cell device 107' comprises matrix memory cells which are implemented by plural memory cells. The memory cells are for holding or memorizing data.

The Y decoder 102, the bank select decoder 103, the X decoder 104, and the virtual GND decoder 105 are connected to the address buffer circuit 101. The virtual GND selector 106 is connected to the virtual GND decoder 105. The matrix memory cell device 107' is connected to the bank select decoder 103, to the X decoder 104, and to the virtual GND selector 106. The Y selector 108 is connected to the Y decoder 102 and to the matrix memory cell device 107'. The sense circuit 109 is connected to the Y selector 108. The output buffer circuit 110 is connected to the sense circuit 109.

The semiconductor memory device 11 is supplied with the address input signal from the outside device. The Y decoder 102, the bank select decoder 103, the X decoder 104, and the virtual GND decoder 105 select, in response to the address input signal, the memory cells in the matrix memory cell device 107'. The Y selector 108, the sense circuit 109, and the output buffer circuit 110 reads out data of the memory cells which are selected.

Figure 9:
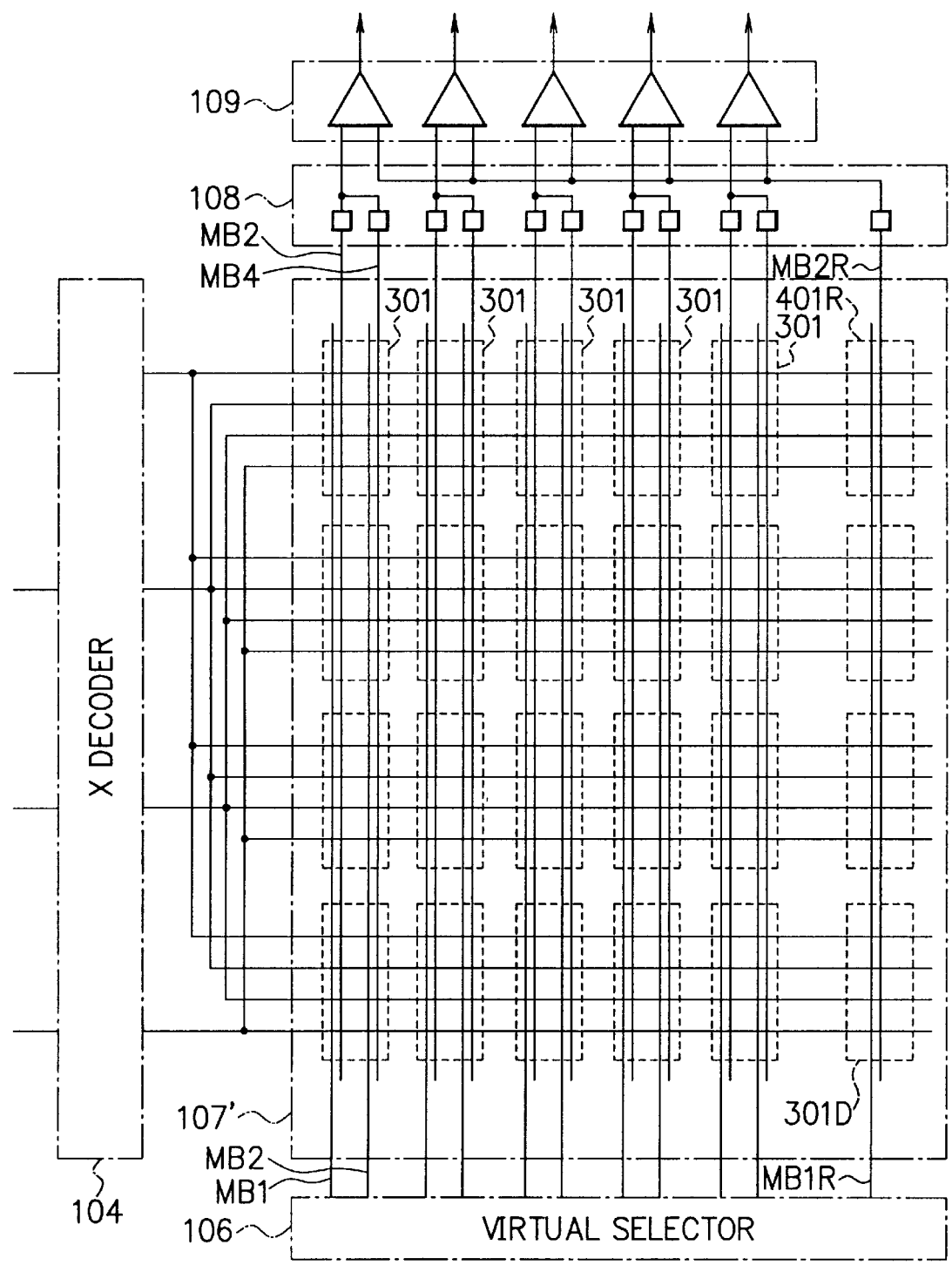
FIG. 9 is a block diagram of a matrix memory cell device of the semiconductor memory device illustrated in FIG. 8.

In FIG. 9, the matrix memory cell device 107' comprises matrix memory cell banks 301, reference cell bank devices 401R, and a dummy bank 301D. The matrix memory cell banks 301 comprises a first set of memory cells, respectively. The first set of memory cells are for holding data.

Figure 10:
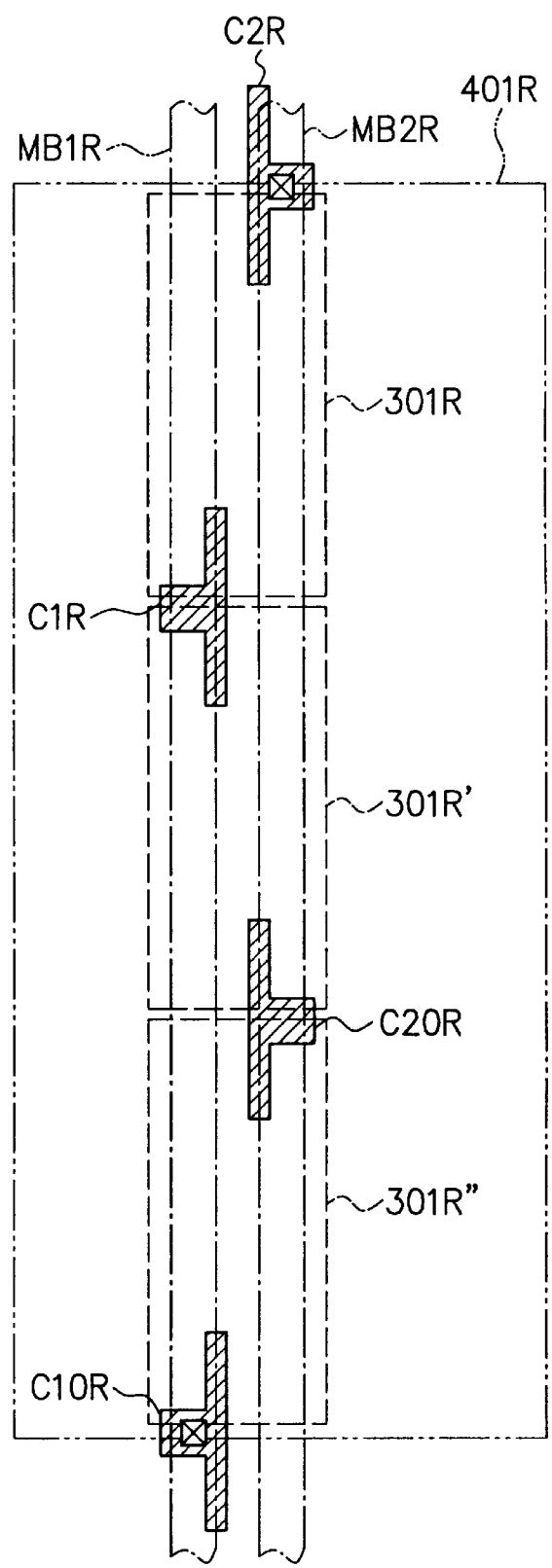
FIG. 10 is a view of a layout pattern of a reference cell bank device of the semiconductor memory device illustrated in FIG. 8.

In FIG. 10, each of the reference cell bank devices 401R comprises reference cell banks 301R, 301R , and 301R" which are directly connected. Each of the reference cell banks 301R, 301R', and 301R" comprises a second set of reference cells. The reference cells of the reference cell banks 301R, 301R', and 301R" hold reference voltages.

In FIG. 9, the word lines W1 , W2, W3, and W4 are, in cross direction, positioned in the memory cell banks 301. The main bit lines MB2 and MB4 are, in machine direction, positioned in the memory cell banks 301 so that the main bit lines MB2 and MB4 are, in cross, positioned to the word lines W1 to W4. Also, virtual GND lines MB1 and MB3 are, in parallel to the main bit lines MB2 and MB4 in the memory cell banks 301.

The word lines W1 to W4 are, in cross direction, positioned in the reference cell bank device 401R. The main bit line MB2R is, in machine direction, positioned in the reference cell bank device 401R so that the main bit line MB2R is, in cross, positioned to the word lines W1 to W4. Also, virtual GND lines MB1R is, in parallel to the main bit line MB2R in the reference cell bank device 401R. In addition, such as a method of connecting the word lines W1 to W4, the main bit lines MB2, MB4, and MB2R, and the virtual GND lines MB1, MB3, and MB1R and a method of selecting the memory cell will later be described in detail.

On the other hand, the X decoder 104 selects, in response to the address input signal, one of the word lines W1 to W4. The X decoder 104 selects one set of the memory cell which are, in cross direction, positioned in each of the memory cell banks 301 and the reference cell bank device 401R.

The virtual selector 106 is connected to the virtual GND lines MB1, MB3, and MB1R. The virtual selector 106 selects one of the virtual GND lines MB1, MB3, and MB1R to connect the memory cell to be selected to the ground.

The Y selector 108 is connected to the main bit lines MB2, MB4, and MB2R from each of the memory cell banks 301 and the reference cell bank device 401R. In addition, the transistor switches 108A, 108B, and 108C of the Y selector 108 are connected to the main bit lines MB2, MB4, and MB2R. The Y selector 108 selects one of the main bit lines MB2, MB4, and MB2R.

The sense circuit 109 is, through the Y selector 108, connected to one of the main bit lines MB2 and MB4 from the and the memory cell banks 301 and the main bit lines MB2R from the reference cell bank device 401R. The sense circuit 109 compares data voltages from the memory cell banks 301 with the reference voltages from the reference cell bank device 401R to determine levels of the data which are read out.

In FIG. 10, the reference cell bank device 401R comprises contact areas C2R and C10R. The contact areas C2R and C10R are, through contact holes, connected to the main bit line MB2R and the virtual GND line MB1R, respectively. The reference cell bank 301R is connected to the reference cell bank 301R' through the contact area C1R. The reference cell bank 301R' is connected to reference cell bank 301R" through a contact area C20R. The contact area C1R, which connects the reference cell bank 301R to the reference cell bank 301R', has not a contact hole. As a result, the contact area C1R is not connected to the main bit line MBLR. Likewise, the contact area C20R, which connects the reference cell bank 301R' to the reference cell bank 301R", has not a contact hole. As a result, the contact area C20R is not connected to the virtual GND line MB1R. Namely, a combination of the reference cell banks 301R, 301R', and 301R" which are directly connected serves as the reference cell bank device 401R. In addition, the dummy bank 301D is not used for reading data. Also, the only contact area C10R is connected to the virtual GND line MB1R.

Figure 11:
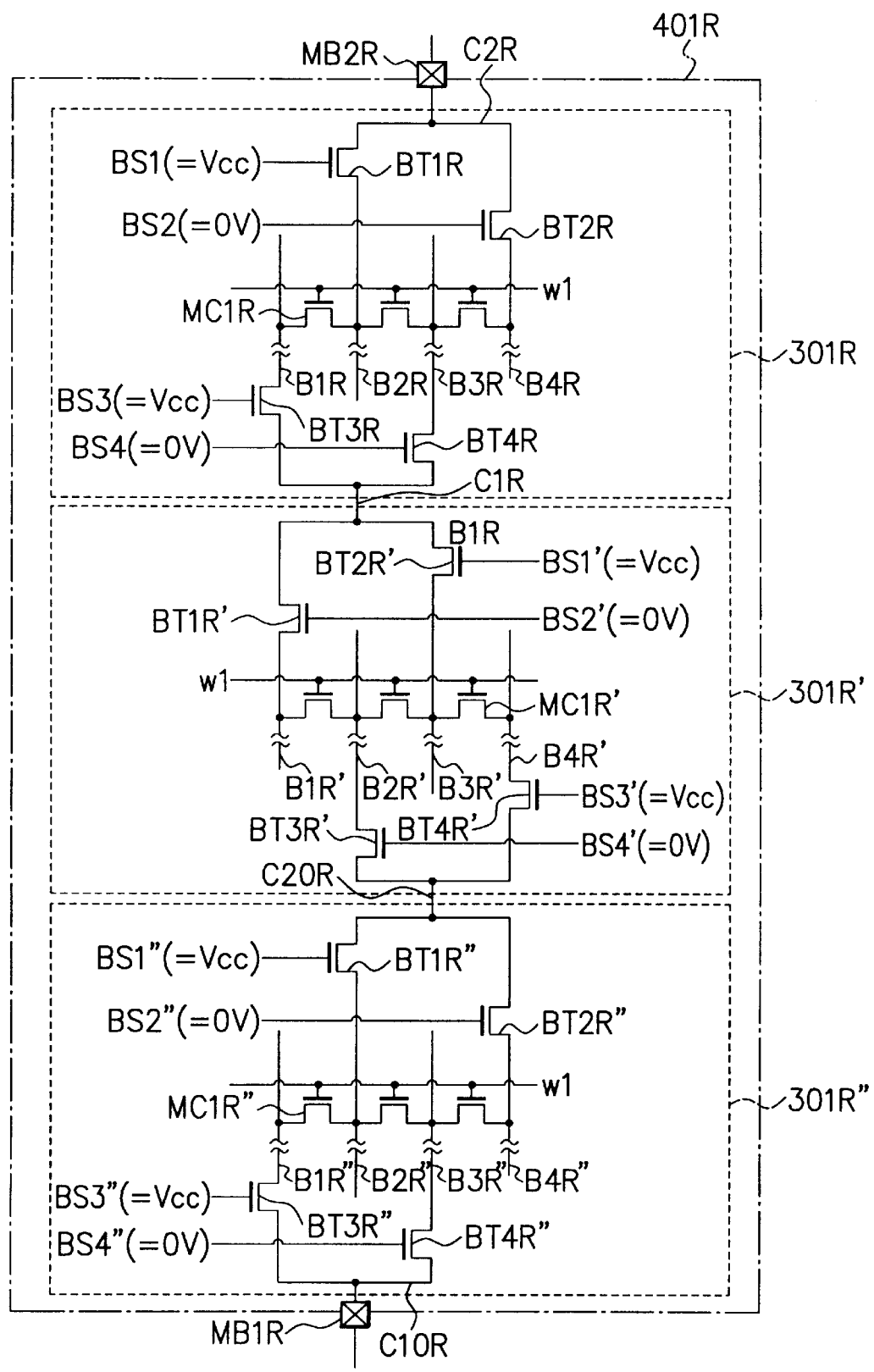
FIG. 11 is a circuit diagram of the reference cell bank device illustrated in FIG. 10.

In FIG. 11, the reference cell bank 301R comprises the contact area C2R connected to the main bit line MB2R and bank select transistors BT1R and BT2R connected to the contact area C2R. The bank select line BS1 is connected to the bank select transistor BT1R. The bank select line BS2 is connected to the bank select transistor BT2R. The deputy bit line B2R is connected to the bank select transistor BT1R. The deputy bit line B4R is connected to the bank select transistor BT2R.

On the other hand, the bank select transistors BT3R and BT4R are connected to the contact area C1R which is positioned in a side opposite to the contact area C2R. The bank select line BS3 is connected to the bank select transistor BT3R. The bank select line BS4 is connected to the bank select transistor BT4R. The deputy bit line B1R is connected to the bank select transistor BT3R. The deputy bit line B3R is connected to the bank select transistor BT4R. Also, the memory cells and the words lines are positioned between the deputy bit lines. In order to simplify the description, the three memory cells MC1R and the word line W1 connected to gate electrodes of the memory cells MC1R are shown in FIG. 11.

Each of the reference cell banks 301R ' and 301R" is same to the reference cell banks 301R. Namely, the reference cell bank 301R ' comprises the contact area C1R connected to the reference cell bank 301R and bank select transistors BT1R ' and BT2R' connected to the contact area C1R. The bank select line BS2 ' is connected to the bank select transistor BT1R'. The bank select line BS1' is connected to the bank select transistor BT2R '. The deputy bit line B1R is connected to the bank select transistor BT1R '. The deputy bit line B3R ' is connected to the bank select transistor BT2R'.

On the other hand, the bank select transistors BT3R' and BT4R ' are connected to the contact area C20R which is positioned in a side opposite to the contact area C1R. The bank select line BS4' is connected to the bank select transistor BT3R'. The bank select line BS3' is connected to the bank select transistor BT4R'. The deputy bit line B2R' is connected to the bank select transistor BT3R'. The deputy bit line B4R' is connected to the bank select transistor BT4R'. Also, the memory cells and the words lines are positioned between the deputy bit lines. In order to simplify the description, the three memory cells MC1R ' and the word line W1 connected to gate electrodes of the memory cells MC1R ' are shown in FIG. 11.

The reference cell bank 301R" comprises the contact area C20R connected to the reference cell bank 301R' and bank select transistors BT1R" and BT2R" connected to the contact area C20R. The bank select line BS1" is connected to the bank select transistor BT1R". The bank select line BS2" is connected to the bank select transistor BT2R". The deputy bit line B2R" is connected to the bank select transistor BT1R". The deputy bit line B4R" is connected to the bank select transistor BT2R".

On the other hand, the main bit line MB1R is connected to the contact area C10R which is positioned in a side opposite to the contact area C20R. The bank select transistors BT3R" and BT4R" are connected to the contact area C10R. The bank select line BS3" is connected to the bank select transistor BT3R". The bank select line BS4" is connected to the bank select transistor BT4R". The deputy bit line B1R" is connected to the bank select transistor BT3R".

The deputy bit line B3R" is connected to the bank select transistor BT4R". Also, the memory cells and the words lines are positioned between the deputy bit lines. In order to simplify the description, the three memory cells MC1R" and the word line W1 connected to gate electrodes of the memory cells MC1R" are shown in FIG. 11.

Thus, each of the reference cell banks 401R comprises the three reference cell banks. Also, the reference cell bank is same to the memory cell bank. In this semiconductor memory device of the first embodiment, the reference cell bank has the main bit line and the virtual GND line.

Figure 12:
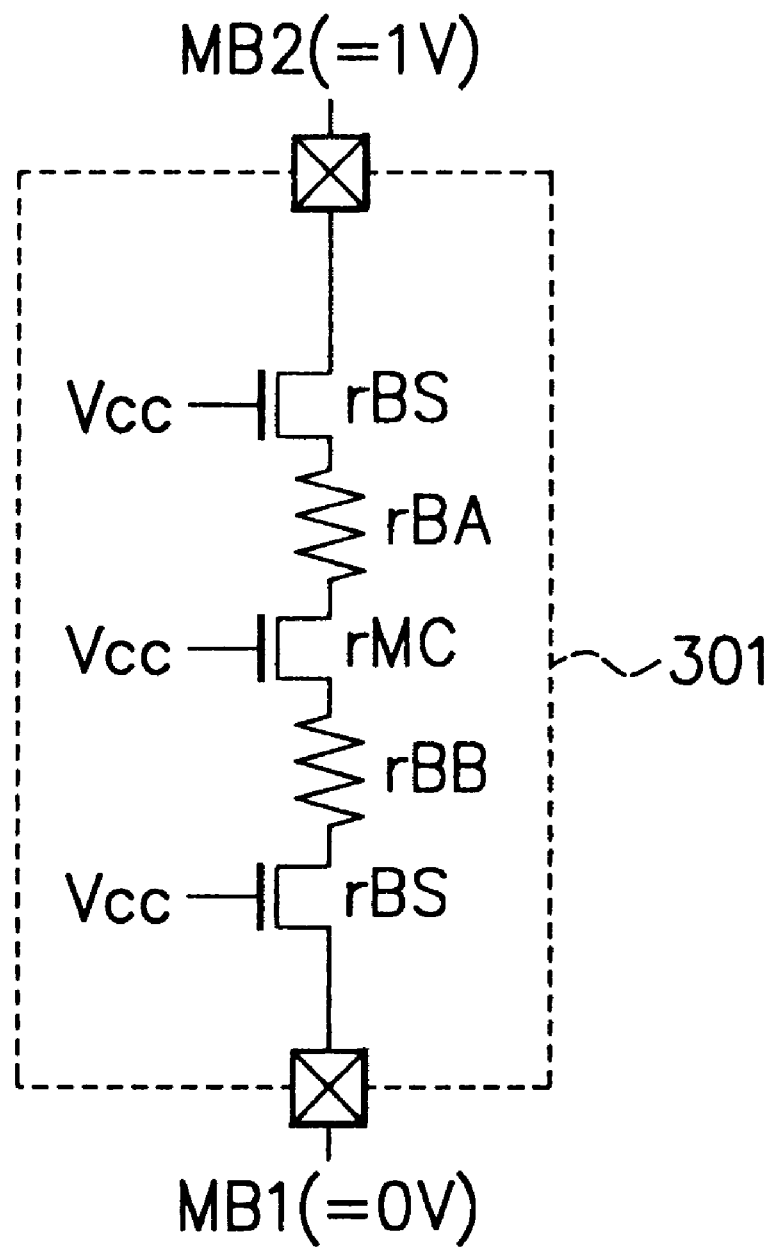
FIG. 12 is a circuit diagram of an equivalent circuit of a memory cell bank of the semiconductor memory device illustrated in FIG. 8.
Figure 13:
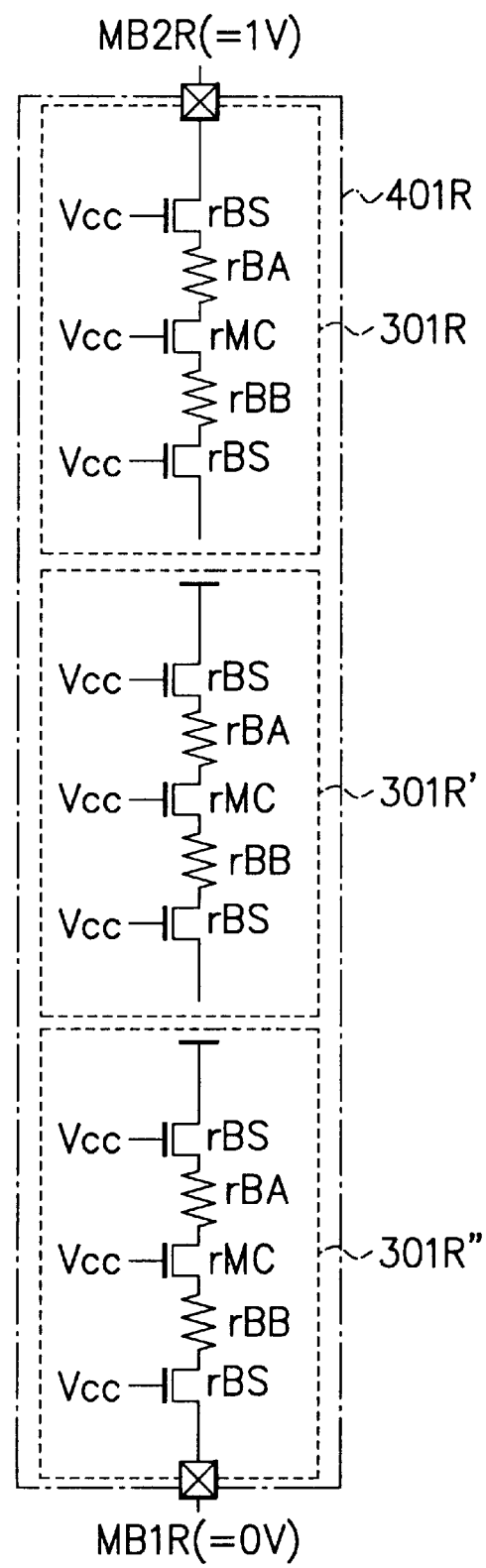
FIG. 13 is a circuit diagram of an equivalent circuit of the reference cell bank device of the semiconductor memory device illustrated in FIG. 8.

In FIG. 12 and FIG. 13, the description will proceed to equivalent circuits of the memory cell bank 301 and the reference cell bank 301R. In FIG. 12, the equivalent circuit of the memory cell bank 301 comprises three transistors and two resistors which are connected between the transistors. Also, the reference cell bank device 401R comprises the reference cell banks 301R, 301R', and 301R". Each of the equivalent circuit of the reference cell banks 301R, 301R ', and 301R" is same to the equivalent circuit of the memory cell bank 301. Namely, each of the equivalent circuit of the reference cell banks 301R, 301R ', and 301R" comprises the three transistors and the two resistors which are connected between the transistors.

Here, rBS represents a resistance value of the bank selector when the bank selector is ON, rMC represents a resistance value of the memory cell or the reference cell when the memory cell or the reference cell is ON, and rBA or rBB represents a resistance value of the deputy. It is assumed that a combined resistance of rBA and rBB is represented by rBN. In this event, rBN is given by a following formula (4).

$$rBN=rBA+rBB \quad (4)$$

In the semiconductor memory device according to the first embodiment of this invention, a reference ratio RAT is represented by a following formula (5). The following formula (5) is given by the formulas (3) and (4).

$$RAT=3(2rBS+rBN+rMC)/(2rBS+rBN+rMC)=3 \quad (5)$$

As a result, the reference ratio RAT is set regardless of resistance values of the memory cells and the bank select transistors. Namely, the reference ratio RAT is set regardless of change of a process parameter of manufacturing the semiconductor memory device. In addition, this invention is applicable to the semiconductor memory device which comprises the reference cell bank devices each of the reference cell banks has an odd number of the reference cell banks which are directly connected.

Figure 14:
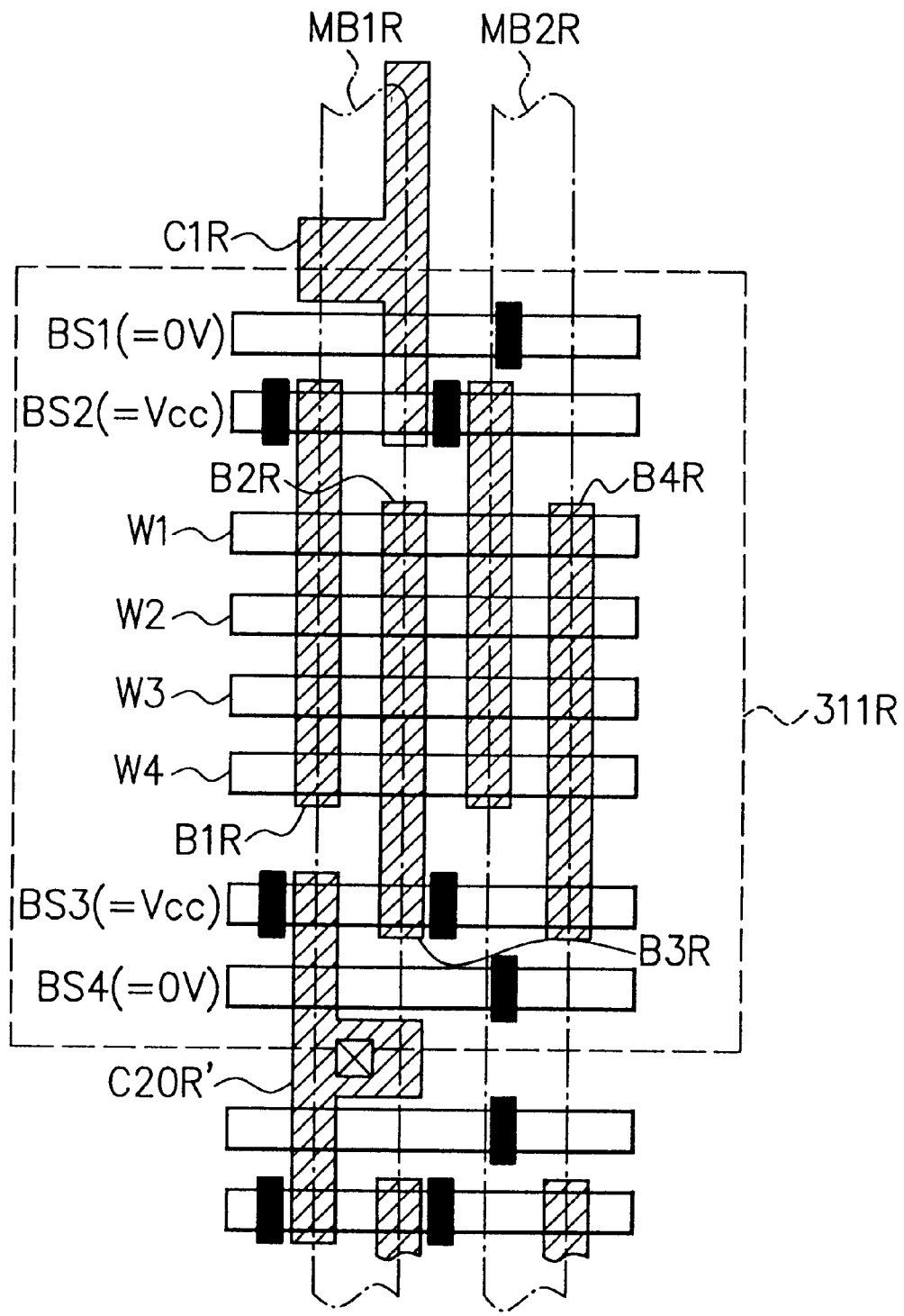
FIG. 14 is a view of a layout pattern of a reference cell bank of a semiconducto memory device according to a second embodiment of this invention.
Figure 15:
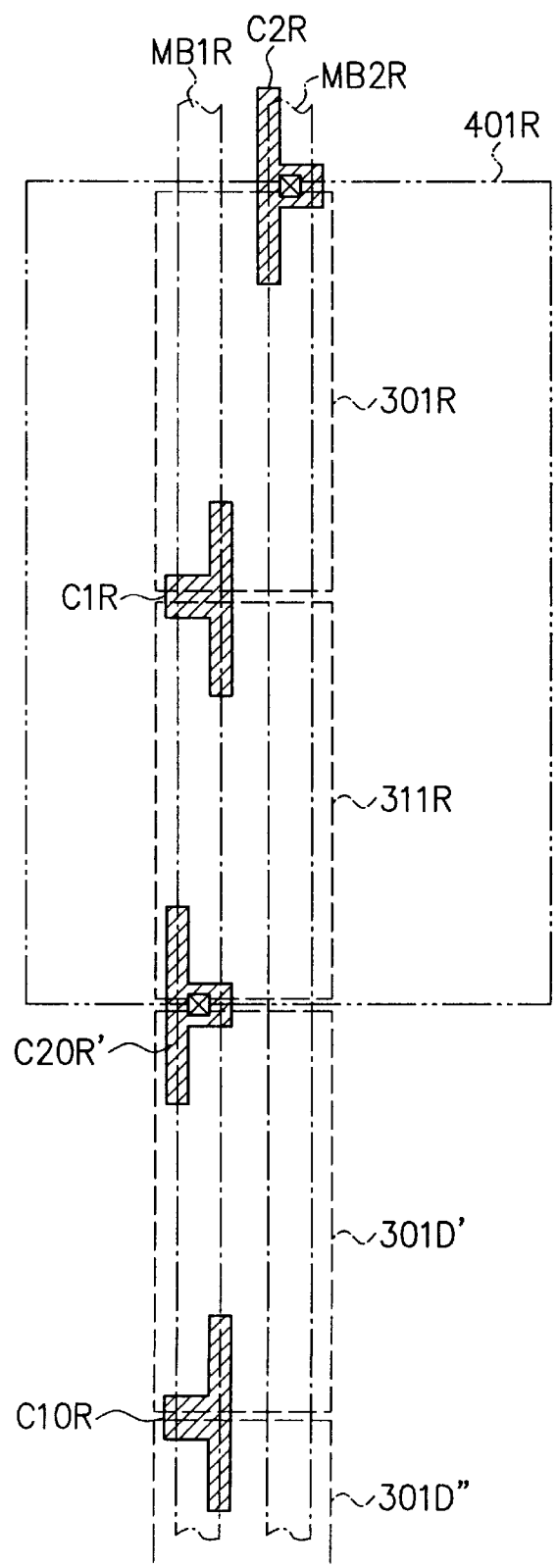
FIG. 15 is a view of a layout pattern of a reference cell bank device of the semiconductor memory device according to the second embodiment of this invention.

Referring to FIGS. 14 and 15, the description will proceed to a semiconductor memory device according to a second embodiment of this invention. Similar parts are designated by like reference numerals.

In FIGS. 14 and 15, the semiconductor memory device comprises the reference cell bank device which has a reference cell banks 311R and the reference cell bank 301R which are directly connected. In FIG. 14, the deputy bit lines B1R to B4R are, in parallel, positioned in the reference cell bank 311R. The word lines W1 to W4 are positioned in the reference cell bank 311R so that the word lines W1 to W4 are crossed to the deputy bit lines B1R to B4R. The bank select lines BS1 and BS2 are, in parallel, positioned in a side of the contact area C1R from the word lines W1 to W4. The bank select lines BS3 and BS4 are, in parallel, positioned in a side of the contact area C20R' from the word lines W1 to W4.

In addition, it needs to prevent leak of currents which are supplied to the bank select lines BS1 to BS4, namely, it needs to prevent occurrence of a parasitic transistor of N type in the reference cell bank 311R. Therefore, channel stopper layers 303 are formed in the reference cell bank 311R by implanting ions of impurities of P type in the reference cell bank 311R. For example, the impurities of P type are implemented by boron.

On the other hand, in the semiconductor memory device according to the second embodiment of this invention, the contact areas C1R and C20R' are formed on the virtual GND line MB1R and the contact area is not formed on the main bit line MB2R. Therefore, a current flows among the virtual CND line MB1R, the contact area C1R, the deputy bit line B1R, the deputy bit line B2R, the contact area C20R', and the virtual CND line MB1R.

In FIG. 15, the semiconductor memory device comprises the reference cell bank device which has the reference cell banks 311R and the reference cell bank 301R which are directly connected. As a result, a current flows among the main bit line MB2R, the contact area C2R, the contact area C1R, the contact area C20R', and virtual CND line MB1R.

Thus, according to the second embodiment of this invention, this invention is applicable to the semiconductor memory device which comprises the reference cell bank devices each of the reference cell banks has an even number of the reference cell banks which are directly connected. Namely, according to the first and second embodiments of this invention, this invention is applicable to the semiconductor memory device which comprises the reference cell bank devices each of the reference cell banks has the odd or even number of the reference cell banks which are directly connected. Also, a size of the reference cell bank 311R is same to a size of the reference cell bank 301R. In addition, this invention is applicable to the semiconductor memory device which is implemented by EPROMs or EEPROMs.

According to this invention, there is provided the semiconductor memory device which is capable of easily controlling the reference ratio regardless of change of the process parameter in case of manufacturing the semiconductor memory device.

Also, according to this invention, there is provided the semiconductor memory device which is capable of increasing a sense speed of the semiconductor memory device.

What is claimed is:

1. A semiconductor memory device comprising:
    plural matrix memory cell banks, a reference cell bank device, a sense circuit, and a virtual ground selector, said matrix memory cell banks and said reference cell bank device having deputy bit lines comprising embedded diffused layers,
    each of said matrix memory cell banks comprising a set of memory cells for holding data voltages,
    said reference cell bank device comprising at least three reference cell banks that are connected to each other and that each comprises reference cells for holding reference voltages,
    said sense circuit being connected to said matrix memory cell banks and, through a main bit line, to a first one of said reference cell banks, for receiving data voltages that are read from said matrix memory cell banks and for receiving reference voltages that are read from said reference cell bank device, to compare the data voltages to the reference voltages,
    said virtual ground selector being connected through a virtual ground line to a second one of said reference cell banks, a third one of said reference cell banks being directly connected to both said first and second reference cell banks and not directly connected to either said main bit line or said virtual ground line.

2. The memory device of claim 1, further comprising a plurality of said reference cell bank device.

3. The memory device of claim 1, wherein the memory device is implemented by mask ROMs of flat cell type.

4. A method of manufacturing a semiconductor memory device comprising the steps of:

provides the device with plural matrix memory cell banks, a reference cell bank device, a sense circuit, and a virtual ground selector, where the matrix memory cell banks and the reference cell bank device have deputy bit lines with embedded diffused layers, where each of the matrix memory cell banks includes a set of memory cells for holding data voltages and the reference cell bank device includes at least three reference cell banks that are connected to each other and that each include reference cells for holding reference voltages;

connecting the sense circuit to the matrix memory cell banks and, through a main bit line, to a first one of the reference cell banks, so that the sense circuit is adapted to receive data voltages from the matrix memory cell banks and reference voltages from the reference cell bank device, to compare the data voltages to the reference voltages;

connecting the virtual ground selector through a virtual ground line to a second one of the reference cell banks; and directly connecting a third one of the reference cell banks to both the first and second reference cell banks and not directly connecting the third reference cell bank to either the main bit line or the virtual ground line.

* * * * *